United States Patent
Olive et al.

(10) Patent No.: US 10,747,912 B2
(45) Date of Patent: Aug. 18, 2020

(54) METHOD FOR MODELLING A BATHTUB OF A BLADE

(71) Applicant: SAFRAN AIRCRAFT ENGINES, Paris (FR)

(72) Inventors: Remi Philippe Oswald Olive, Moissy-Cramayel (FR); Sergio Lavagnoli, Brussels (BE); Cis Guy Monique De Maesschalck, Kortrijk (BE); Guillermo Paniagua, Nossegem (BE)

(73) Assignee: SAFRAN AIRCRAFT ENGINES, Paris (FR)

( * ) Notice: Subject to any disclaimer, the term of this patent is extended or adjusted under 35 U.S.C. 154(b) by 153 days.

(21) Appl. No.: 15/324,198

(22) PCT Filed: Jul. 10, 2015

(86) PCT No.: PCT/FR2015/051918
§ 371 (c)(1),
(2) Date: Jan. 5, 2017

(87) PCT Pub. No.: WO2016/005708
PCT Pub. Date: Jan. 14, 2016

(65) Prior Publication Data
US 2017/0199945 A1    Jul. 13, 2017

(30) Foreign Application Priority Data

Jul. 10, 2014   (FR) ..................................... 14 56680

(51) Int. Cl.
*G06F 30/00*        (2020.01)
*F01D 5/20*         (2006.01)
(Continued)

(52) U.S. Cl.
CPC ............. *G06F 30/00* (2020.01); *F01D 5/147* (2013.01); *F01D 5/20* (2013.01); *G06F 30/15* (2020.01);
(Continued)

(58) Field of Classification Search
CPC .. G06F 17/50; G06F 17/5095; G06F 17/5018; F01D 5/147; F01D 5/20; F05D 2230/50; F05D 2220/32
(Continued)

(56) References Cited

U.S. PATENT DOCUMENTS

| | | | |
|---|---|---|---|
| 2009/0180887 A1* | 7/2009 | Mischo | F01D 5/20 416/223 R |
| 2011/0135496 A1 | 6/2011 | Botrel et al. | |
| 2014/0037458 A1 | 2/2014 | Lacy et al. | |

OTHER PUBLICATIONS

Ameri et al. "Effect of Squealer Tip on Rotor Heat Transfer and Efficiency" ASME Journal of Turbomachinery, vol. 120, No. 4., Oct. 1998, pp. 753-759.*

(Continued)

*Primary Examiner* — Saif A Alhija
(74) *Attorney, Agent, or Firm* — Oblon, McClelland, Maier & Neustadt, L.L.P.

(57) ABSTRACT

A method for modeling at least one portion of a bathtub of a blade, the method including parametrizing a volume representing the bathtub portion as a set of markers extending from a reference transverse surface of the blade, the blade physically including the markers, and each marker associated with an elementary surface selected among a plurality of elementary surfaces forming a partition of at least one portion of the reference transverse surface; and defined by a marker height relative to the reference surface; determining optimized values of the marker heights relative to a given aerodynamic and/or thermal criterion; reproducing, on an interface of the device, the values thus determined.

11 Claims, 7 Drawing Sheets

(51) Int. Cl.
 *G06F 30/15* (2020.01)
 *G06F 30/23* (2020.01)
 *F01D 5/14* (2006.01)
(52) U.S. Cl.
 CPC .......... *G06F 30/23* (2020.01); *F05D 2220/32* (2013.01); *F05D 2230/50* (2013.01); *Y02T 90/50* (2018.05)
(58) Field of Classification Search
 USPC ............................................................ 703/1
 See application file for complete search history.

(56) References Cited

OTHER PUBLICATIONS

International Search Report dated Oct. 15, 2015 in PCT/FR2015/051918 (with English translation).
French Preliminary Search Report and Written Opinion dated May 11, 2015 in Patent Application No. 1456680 (with English translation of categories of cited documents).
A. A. Ameri et al., "Effect of Squealer Tip on Rotor Heat Transfer and Efficiency", Journal of Turbomachinery, vol. 120, No. 4, XP055187543, Oct. 1998, pp. 753-759.
Sang Woo Lee et al., "Effects of squealer rim height on aerodynamic losses downstream of a high-turning turbine rotor blade", Experimental Thermal and Fluid Science, vol. 32, No. 8, XP24098072, 2008, pp. 1440-1447.
C. De Maesschalck et al., "Blade Tip Shape Optimization for Enhanced Turbine Aerothermal Performance", Journal of Turbomachinery, vol. 136, No. 4, XP055117474, Apr. 2014, pp. 041016-1-041016-11.

\* cited by examiner

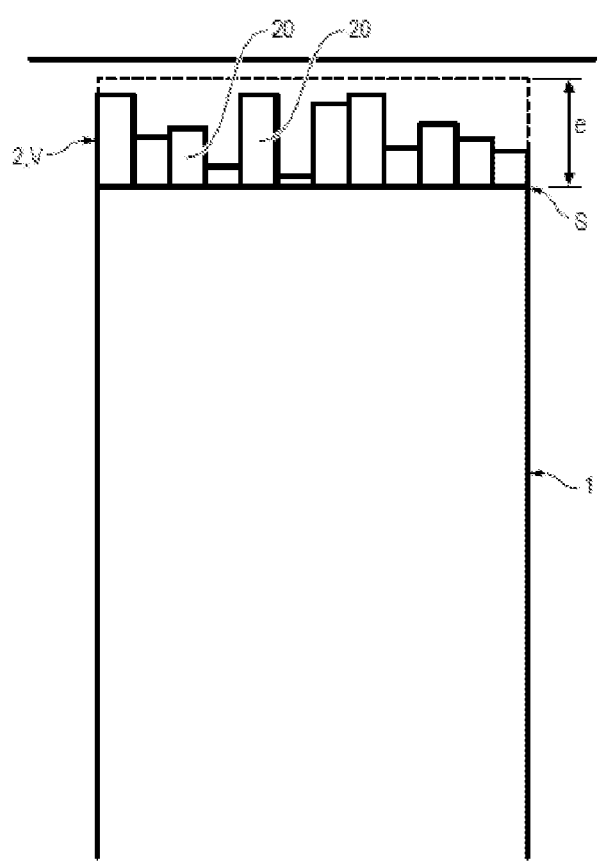

METHOD FOR MODELLING A BATHTUB OF A BLADE

GENERAL TECHNICAL FIELD

The present invention relates to computer-aided design.

More precisely, it relates to a method for modeling a bathtub at the tip of a blade.

PRIOR ART

A disk having a plurality of blades on its periphery, in rotation inside a turbine engine, is called an impeller. At the tip of each blade 1, as may be seen in FIG. 1a, a clearance exists with respect to the casing that surrounds the impeller, allowing relative rotation of the impeller with respect to the casing.

Due to the difference in pressure between the lower surface and the upper surface of the blade, and the movement of the impeller, a leakage flow occurs at this clearance. This flow is the source of numerous aerodynamic and aerothermal problems. It produces, at the upper surface in particular, a vortex which dissipates within the channel (due to the divergence of the channel of the turbines, see FIG. 1b) usually called a "clearance vortex." Due to the local increase at the tip of the speed of the hot fluid during leakage flows near the wall, heat transfer increases due to forced convection.

The smaller the clearance, the better is the efficiency of the impeller due to a reduction in the leakage flow rate. However, a non-zero clearance must be maintained to avoid the tip of the blade rubbing against the wall of the casing.

In fact, the intensity of the friction causes an increase in temperature in the tip of the blade assembly and the casing, which accelerates their wear without considering the mechanical problems (contact) related to an element rotating at high speed. This has an immediate effect of the lifetime of the blade and the casing.

Figure 2A:
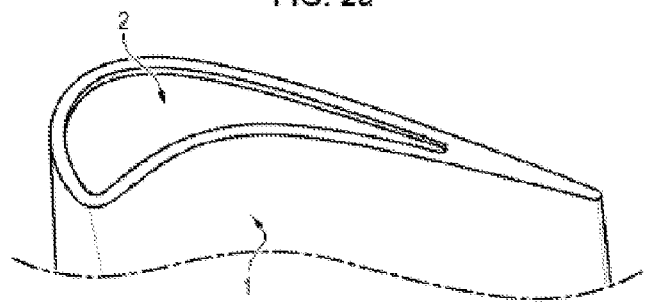

So as to limit these problems due to friction, what is called a "bathtub" 2 has been installed at the tip of the blade assembly. An example of one is shown in FIG. 2a. What is meant by a bathtub is an open cavity extending from the tip of the blade, with a small height (a few millimeters) and with a possibly complex shape.

The aim is to reduce the surface area at the end of the blade so as to tolerate contact while reducing friction. The height of the bathtub is calculated so that the wear accounts for the entire operating life of the blade.

Figure 2B:
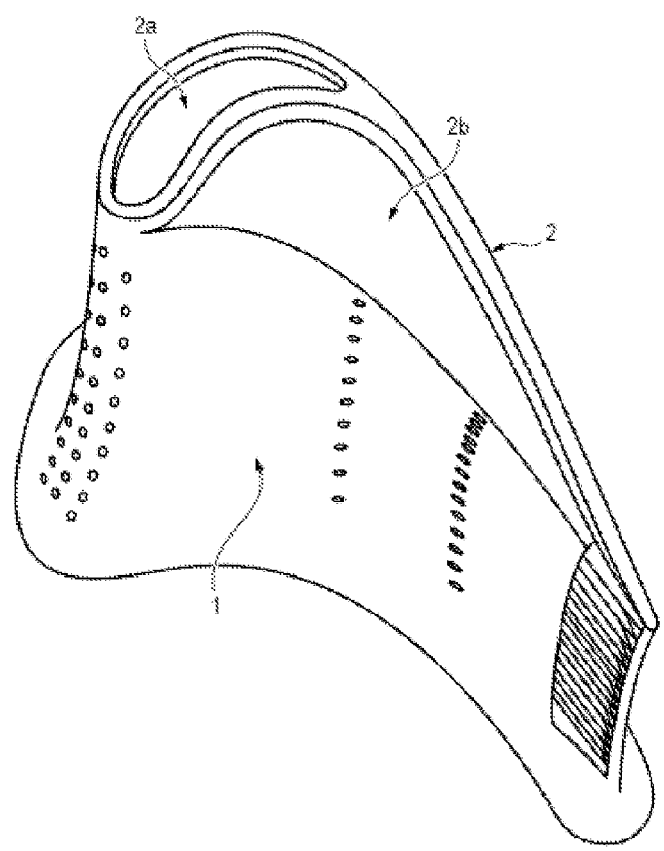

Moreover, studies have shown that this technology makes it possible to obtain better aerodynamic performance, particularly by influencing leakage and passage vortices. Bathtubs 2 with highly evolved shapes have been proposed. One may cite patent application EP1748153 which proposes a bathtub (delimiting a closed cavity 2a and an open cavity 2b) as shown in FIG. 2b.

It would be desirable to further improve bathtub geometries so as to further reduce aerodynamic losses and wear, particularly thermal and mechanical, and to consequently improve the performance of turbine engines (increase in efficiency, in lifetime, improvement of mechanical behavior, reduction of fuel consumption, etc.)

Numerous computer tools for modeling blades or other aeronautical parts are known, which make it possible to help design these parts by automatically optimizing certain of the characteristics. The principle is to determine optimum geometric aeromechanical laws of the part, in other words one or more curves describing the value of a physical quantity (such as efficiency or pressure rise) along a portion of the part, in a given environment, by executing a large number of simulation calculations.

These tools apply to bathtubs to the extent that a general geometry is defined (for example number of cavities, number of openings, existence of a winglet, of a deflector, etc.). In other words, prior knowledge of the topology is necessary, which substantially limits the originality of bathtub geometries which may be obtained, without strongly increasing the calculating power employed.

It thus remains very difficult to improve bathtubs, so that only a small number of topologies has been explored.

It would therefore be desirable to find an innovative method to model blade bathtubs which allows a substantial improvement of their aerodynamic performance while being economical in terms of use of computer resources.

PRESENTATION OF THE INVENTION

The present invention proposes, according to a first aspect, a method for modeling at least a portion of a bathtub of a blade, the method being characterized in that it comprises performing, by data processing means of a piece of equipment, steps of:

(a) Parameterization of a volume representing said bathtub portion as an assembly of blocks extending from a transverse reference surface of the blade, the blade physically comprising the blocks, and each block being:
  associated with an elementary surface selected from among a plurality of elementary surfaces forming a partition of at least a portion of said transverse reference surface; and
  defined by a block height with respect to said reference surface;

(b) Determination of optimized values of the block heights with respect to a given aerodynamic and/or thermal criterion;

(c) Output on an interface of said equipment of the values thus determined.

According to other advantageous and non-limiting features:

the values optimized with respect to a given aerodynamic criterion determined at step (b) are the values of the heights of the blocks for which the aerodynamic losses and/or the thermal impact at the bathtub are minimum;

the number of elementary surfaces is comprised between 3 and 1000, preferably between 20 and 300;

the elementary surfaces form a partition of said transverse reference surface based on a given mesh;

each block is a cylindrical element having as its base the elementary surface with which it is associated;

each block height with respect to said reference surface is less than a maximum reference height depending on a height of the blade;

said maximum reference height is less than 25%, preferably comprised between 1% and 7% of the height of the blade;

said maximum reference height is such that the majority of the blocks have an optimized value of block height of zero;

step (b) comprises the fusion of at least two connected elementary surfaces, a common optimized block height value being determined for the blocks associated with fused elementary surfaces;

step (c) comprises fusion into a block of blocks determined as having a non-zero optimized block height value and for which the associated elementary surfaces are connected, a smoothing of the edges of the blocks being performed.

According to a second, then a third aspect, the invention relates to a method for manufacturing a turbine engine blade, the method comprising steps of:
Applying the method according to the first aspect so as to model at least a portion of a bathtub of the blade;
Manufacturing said blade in conformity with the modeling of the at least one portion of the bathtub obtained; as well as an impeller comprising a plurality of blades obtained via the method according to the second aspect.

According to a fourth aspect, the invention relates to equipment for modeling at least one portion of a bathtub of a blade, characterized in that it comprises data processing means configured to implement:
A module for parameterization of a volume showing said bathtub portion as an assembly of blocks extending from a transverse reference surface of the blade, the blade physically comprising the blocks, and each block being:
associated with an elementary surface selected from among a plurality of elementary surface forming a partition of at least a portion of said transverse reference surface; and
defined by a block height with respect to said reference surface;
A module for determining optimized values of block heights with respect to a given aerodynamic and/or thermal criterion;
A module for outputting on an interface of said equipment the determined values.

According to a fifth and sixth aspect, the invention relates respectively to a computer program product comprising code instructions for executing a method according to the first aspect of the invention for modeling at least a portion of a bathtub of a blade; and a storage means readable by computer equipment on which a computer program product comprises code instructions for execution of a method according to the first aspect of the invention for modeling at least a portion of a bathtub of a blade.

PRESENTATION OF THE FIGURES

Figure 1A:
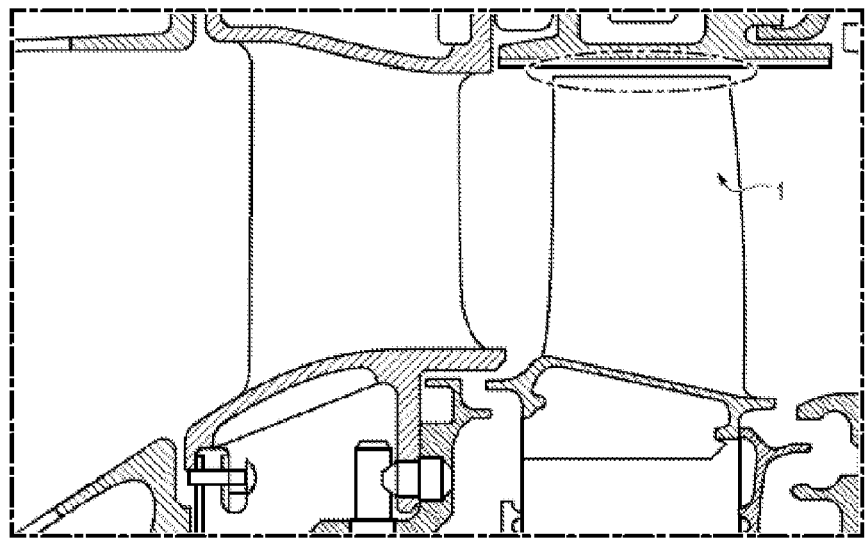
Figure 1B:
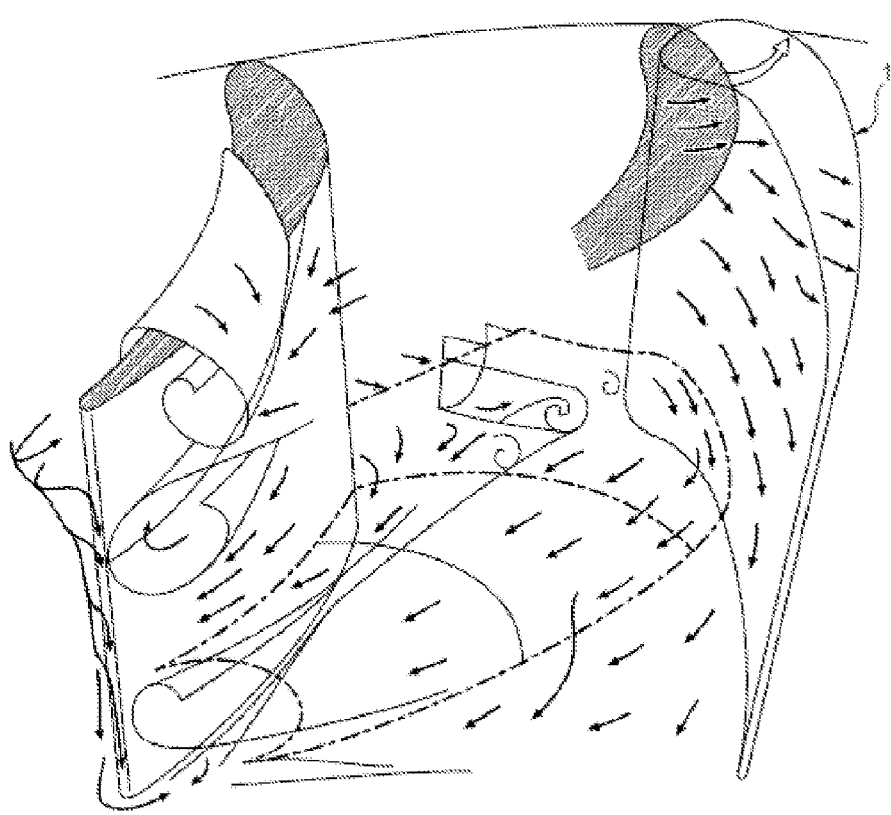
Figure 4:
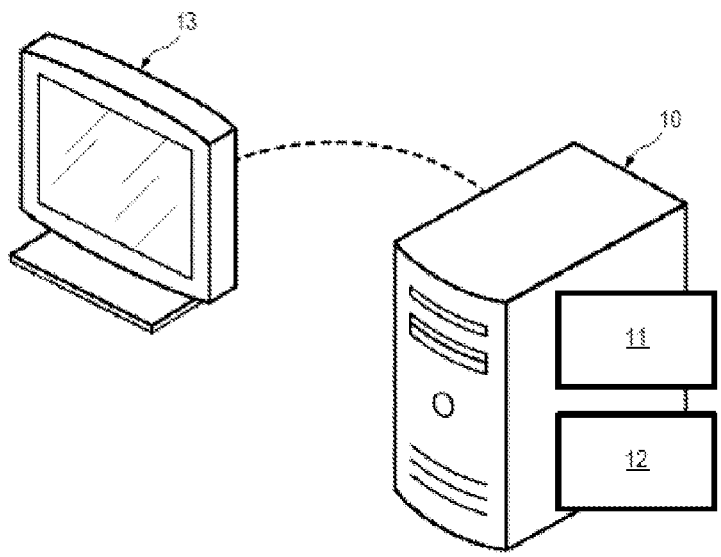
Figure 5A:
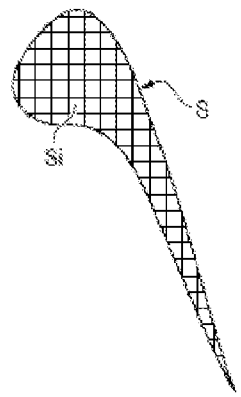
Figure 5B:
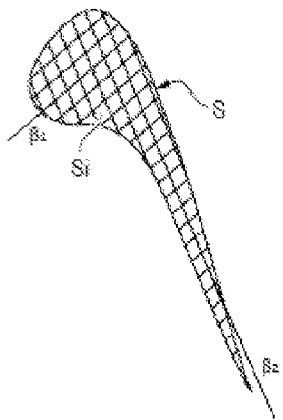
Figure 5C:
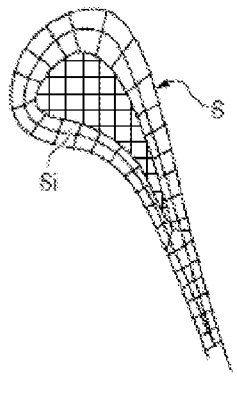

Other features and advantages of the present invention will appear upon reading the description that follows of a preferred embodiment. This description will be given with reference to the appended drawings wherein:
FIG. 1a, previously described, shows an impeller blade of a turbine engine;
FIG. 1b, previously described, illustrates the flows occurring at the tip of the blades;
FIGS. 2a-2b, previously described, illustrate known bathtubs;
FIG. 3 shows a bathtub modeled by a method according to the invention;
FIG. 4 shows a system for applying the method according to the invention;
FIGS. 5a-5c show three examples of meshing a reference surface used in the method according to the invention;
FIGS. 6a-6d show four successive steps to obtaining a final geometry of blade tip.

DETAILED DESCRIPTION

Modeling by Blocks
The present method is a method for modeling at least one bathtub 2 portion of a blade 1. Hereafter in the present description, the example of modeling a complete bathtub will be used.

The present method proposes, originally, to represent a bathtub not as a cavity (i.e. removal of material) at the end of the blade 1, but as a protrusion (i.e. addition of material) consisting of a volume (in the sense of a solid) V at the end of the blade 1.

More precisely, with reference to FIG. 3, the tip of the blade 1 is discretized into a certain number of "blocks" (which will be described in more detail later) of variable height.

The bathtub portion 2 is modeled, during its design, by computer equipment 10 of the type of that shown in FIG. 4. It comprises data processing means 11 (one or more processors), data storage means 12 (for example one or more hard disks), interface means 13 (composed of data input means such as a keyboard and a mouse or a tactile interface, and data output means such as a screen for displaying results). Advantageously, the equipment 10 is a supercomputer, but it will be understood that implementation on varied platforms is entirely possible.

The optimization is performed with respect to an aerodynamic and/or thermal criterion. In other words only the aerodynamic criterion may be favored, only the thermal criterion, or a combination of the two.

By aerodynamic criterion is meant a criterion connected with the performance of the moving blade 1, in particular minimization of the aerodynamic losses at the bathtub 2. It will be understood that other aerodynamic criteria may be selected, by way of example one may attempt to maximize aerodynamic efficiency, etc.

By thermal criterion is meant a criterion connected with the mechanical behavior of the blade 1 at high temperature, in particular minimization of thermal impact, i.e. the decay of the bathtub 2 under the influence of the rise in temperature. In fact it is desired to limit the wear caused by the oxidation thereof at high temperature, for example using a geometry which favors the dissipation or uniformity of the heat. It is important to keep in mind that the gas flow striking one high pressure turbine blade is on the order of 1500° C. At this temperature, the blade may deteriorate very quickly if thermal impact is not controlled. And in this case, even if the best of aerodynamic optimizations is performed, the associated good performance does not persist and risks of technical failure appear (damage to ventilation circuits internal to the blade).

Parameterization
It is necessary to parameterize the bathtub 2 that it is desired to optimize, i.e. the make of it a function of N input parameters. The optimization then consists of varying these different parameters under constraints until their optimal values are determined for the predetermined criterion (aerodynamic losses in particular), so as to determine a "law." A "smoothed" geometry is then obtained by interpolation from the determined crossing points.

The necessary number of calculations is then directly linked (linearly or exponentially) to the number of input parameters of the problem.

It is desirable to use a large number of parameters to thereby increase the quality of the modeling (this is a major issue for designing blades), but such an approach is rapidly limited by the capacity of the resources of current processors.

Even using expensive supercomputers, the time required for modeling is considerable.

Another problem; it is noted that in the presence of a large number of parameters, problems appear: in fact, the laws that are determined have a too great number of crossing points to be satisfied, and the first geometries obtained are abnormally "undulated" and unusable in their current state. They have to be reworked until they are sufficiently smooth, which further increases the time required to obtain results.

As will be seen, the present method allows excellent modeling quality for any geometry of a bathtub 2 (comprising geometries never explored before) which make it possible to obtain a substantial reduction in aerodynamic losses with a limited number of parameters.

In one step (a), performed by the data processing means 11 under the control of an operator, the volume V (mentioned previously) is parameterized representing said bathtub portion 2 as an assembly of blocks 20 extending from a transverse reference surface S of the blade 1.

The reference surface S corresponds advantageously to the surface formed by the tip of the blade (prior to the addition of the bathtub 2). This consists in particular of a profile of the blade 1, extending preferentially in a plane orthogonal to the stacking axis of the blade 1. As may be seen in FIG. 3, the surface S corresponds to a border between the bathtub 2 and the rest of the blade 1.

It is important to understand that the "blocks" 20 physically constitute the bathtub 2, and in that sense are part of the blade 1. The volume V is thus a portion of the volume of the blade. If the method is used to model the totality of the bathtub 2, then the volume V and the bathtub coincide (possibly to within a smoothing operation).

Each block 20 is:
 associated with an elementary surface Si selected from among a plurality of elementary surfaces Si forming a partition of at least one portion of said transverse reference surface 5, and
 defined by a block height with respect to said reference surface S.

Each block is a solid with a pre-determined base (a surface Si) and with a variable height $h_i$.

The bathtub 2 (or portion of the bathtub) is thus parameterized as a vector of dimension N of values $h_i$ of block heights, where N is the number of elementary surfaces Si, and $h_i$ the height of the block 20 from the associated surface Si.

In the case where the totality of the bathtub is modeled, the elementary surfaces form a partition of the entire reference surface S.

The elementary surfaces Si may be obtained by following a given mesh of the surface S, of which three examples are shown in FIGS. 5*a*-5*c*. In FIG. 5*a*, the meshing is Cartesian (the elementary surfaces Si are squares or fragments of a square). In FIG. 5*b*, the meshing follows two angles β1 and β2 corresponding to the two main directions of the profile of the blade 1. It corresponds to a Cartesian meshing in which the mark is not orthogonal (the elementary surfaces S1 are diamonds or fragments of a diamond). In FIG. 5*c*, the meshing is "hybrid," meaning that it is Cartesian in the center of the surface S, and follows the contour of the blade at the edge of the surface S.

Figure 6A:
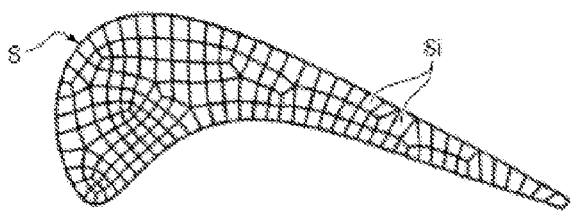

FIG. 6*a* (which will serve as the basis of an example which will be developed hereafter) describes a particular example of meshing with 160 elementary surfaces S1 following only the contour of the blade 1. Such meshing is particularly effective to the extent that it allows modeling of traditional bathtub geometries with precision.

It will be understood, however, that the present method is not limited to any particular distribution of elementary surfaces Si, it is sufficient only that the latter form a partition of the area to be modeled, all having roughly equivalent areas.

The number N of elementary surfaces Si corresponds to the number of input parameters (because an optimal height must be determined per block 20 and therefore per elementary surface Si) and is a minimum of three (lower surface, upper surface and bottom), but preferably it is much greater (the more surfaces Si there are, the better the modeling quality). Current computer resources make it possible to manage up to 1000 surfaces Si, but it will be understood that the interval 20-300 give excellent results (relevant discretization of the surface) for a very reasonable use of computer resources (limitation of the number of optimization parameters). Values of around 200 (160 in the example) are especially preferred.

Every block 20 is a physical element which arises from an elementary surface Si with a height $h_i$ advantageously comprised between 0 and a maximum reference height e, depending on a blade 1 l height. This maximum height e is visible in FIG. 3, and defines the position of the reference surface S in the blade. The height e selected should preferably be equal to the desired depth of the bathtub 2. This makes it possible to maximize the number of blocks 20 for which the optimal height will be zero (i.e. the associated surface Si coincides with the bottom of the bathtub), which reduces the complexity of calculation of the optimization. Each height $h_i$ may be expressed as a fraction of e (comprised between 0 and 100%).

Generally, this height e is selected to be less than 25% of the total height of the blade 1, and preferably it is comprised between 1% and 7% of this height (the bathtub is sufficiently deep while taking into account the wear on the blade during operation).

Each block 20 is advantageously a cylindrical element having as its base the elementary surface Si with which it is associated. "Cylindrical" must be taken in the mathematical sense of the term, and designates any solid delimited by a surface generated by a straight line of constant direction displaced along a closed curve (the generator) and by two parallel planes (its bases). The traditional right circular cylinder, called a cylinder of revolution, is only one example (along with slabs, prisms, etc.). In the present method, it will be understood that each block 20 is a solid with a base Si (with any shape) such that any section along a plane parallel to S is equal to Si.

The volume of such a block 20 is given by the formula $h_i \times s_i$ (where $s_i$ is the area of the elementary surface Si). The total volume v of the volume V (i.e. of the bathtub 2) is then $v = \sum_{i=1}^{N} h_i \times s_i$.

Optimization and Output

According to a second step (b), the method comprises a step of determination, by the data processing means 11, of optimized (and if possible optimal) values of the heights $h_i$ of the blocks. This is an optimization step.

Numerous techniques for performing this step are known to a person skilled in the art, and one could for example have the selected variable parameters vary pseudo-randomly while carrying out simulations for determining these optimized values (i.e. those for which the selected aerodynamic and/or thermal criterion, for example the reduction in clearance vortices, is a maximum). The invention is not, however, limited to this possibility.

It should be noted that preliminary processing may be performed to limit the number of parameters (make it less than N) so as to further speed up modeling.

In particular, step (b) may comprise fusion of blocks 20. This fusion consists of grouping at least two blocks 20 for which the associated elementary surfaces Si are connected, a common optimized value of the block height being determined for these blocks 20. In other words, a single height $h_i$ is determined for two (or more) neighboring blocks 20. This fusion may be determined using genetic algorithms.

In a final step (c), the determined values of the parameter(s) are outputted by the interface means 13 of the equipment 10 for use, for example by displaying the volume V in which these parameters are set to these optimized values.

Figure 6B:
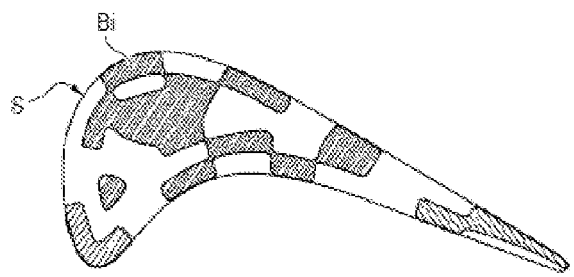

Preferably, the step (c) comprises smoothing the blocks by "blocks." With reference to FIG. 6b, the blocks 20 determined to have a non-zero optimized block height value (in other words the "high" blocks) and for which the associated elementary surfaces Si are connected (i.e. having at least a common tip) are fused in blocks.

Figure 6C:
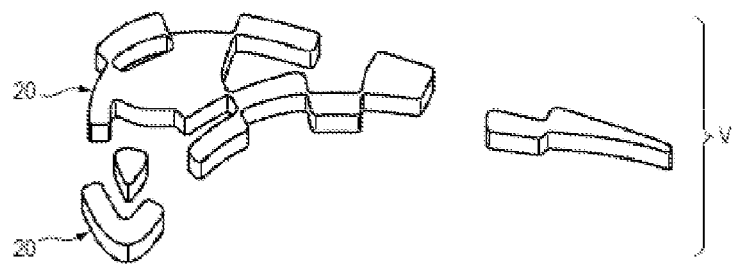
Figure 6D:
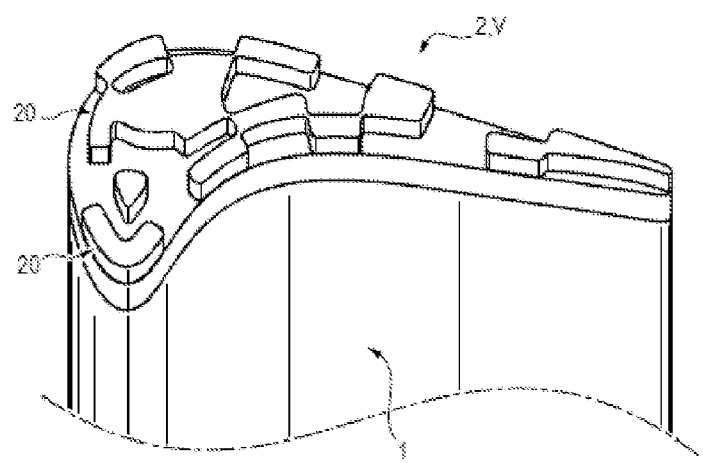

As may be seen in FIG. 6c, the edges of a block are "softened" so that the blocks 20 which compose it form a rim. As may be seen in FIG. 6d, the volume V thus worked may be combined with the rest of the blade 1 for the output of step (c).

Alternatively, the interface means 13 may only display the numerical values of the optimal heights $h_i$.

Manufacturing Method and Blade

Once the bathtub 2 is modeled, the blade 1 may be manufactured. Other modeling methods may naturally be performed to model the rest of the blade 1. A plurality of blades 1 may be assembled so as to obtain a complete impeller.

Thus proposed is a method for manufacturing a blade of a turbine engine, the method comprising steps of:

Applying the method according to the first aspect so as to model at least a portion of the bathtub 2 of the blade 1;
Manufacturing said part in conformity with the modeling of the at least one portion of the bathtub obtained.

The blade thus obtained (the tip whereof has an evolved bathtub modeled as explained previously), has a better-quality geometry reducing clearance vortices and associated losses.

Among the possible manufacturing methods may be cited casting, or direct manufacture (for example additive manufacturing or powder metallurgy).

Equipment

The equipment 10 (shown in FIG. 4) for applying the method for modeling at least one portion of a bathtub 2 of a blade 1 comprises data processing means 11 configured to implement:

A parameterization module of a volume V representing said bathtub 2 portion as an assembly of blocks 20 extending from a transverse reference surface S of the blade 1, the blade 1 physically comprising the blocks 20, and each block 20 being:
associated with an elementary surface Si selected from among a plurality of elementary surfaces Si forming a partition of at least one portion of said transverse surface 5; and
defined by a block height with respect to said reference surface S;
A module for determining optimized values of the block heights with respect to a given aerodynamic and/or thermal criterion;
A module for outputting on an interface 13 of said equipment 10 the determined values.

Computer Program Product

According to other aspects, the invention relates to a computer program product comprising code instructions for executing (on data processing means 11, in particular those of the equipment 10) a method according to the first aspect of the invention for modeling at least a portion of a bathtub 2 of a blade 1, as well as storage means readable by computer equipment (for example a memory 12 of this equipment 10) on which this computer program is located.

The invention claimed is:

1. A method for manufacturing a turbine engine blade, the method comprising:
modeling at least a portion of a bathtub of the turbine engine blade, by a data processor of a piece of equipment, the modeling including the following steps:
(a) parameterizing a volume representing said bathtub portion as an assembly of blocks extending from a transverse reference surface of the turbine engine blade, the turbine engine blade physically comprising the blocks and each block being:
associated with a subsurface selected from among a plurality of subsurfaces forming a partition of at least one portion of said transverse reference surface, and
defined by a block height with respect to said reference surface, a plurality of the blocks having variable and non-uniform block heights, and the variable and non-uniform block heights being used as parameterization parameters,
(b) determining optimized values of the block heights with respect to a given aerodynamic and/or thermal criterion, and
(c) outputting on an interface of said equipment of the values thus determined; and
manufacturing the turbine engine blade in conformity with the modeling of the at least one portion of the bathtub obtained.

2. The method according to claim 1, wherein the values optimized with respect to a given aerodynamic criterion determined at step (b) are the values of the heights of the blocks for which the aerodynamic losses and/or the thermal impact at the bathtub are minimum.

3. The method according to claim 1, wherein a number of subsurfaces is comprised between 3 and 1000.

4. The method according to claim 1, wherein the subsurfaces form a partition of said transverse reference surface based on a given meshing.

5. The method according to claim 1, wherein each block is a cylindrical element having as its base the subsurface with which it is associated.

6. The method according to claim 1, wherein each block height with respect to said reference surface is less than or equal to a maximum reference height depending on a height of the turbine engine blade.

7. The method according to claim 6, wherein said maximum reference height is less than 25% of the height of the turbine engine blade.

8. The method according to claim 6, wherein said maximum reference height is such that some, but not all, of the blocks have an optimized value of block height of zero.

9. The method according to claim 1, wherein step (b) comprises a fusion of at least two connected subsurfaces, a common optimized block height value being determined for the blocks associated with fused subsurfaces.

10. The method according to claim 1, wherein step (c) comprises fusion into a block of blocks determined as having a nonzero optimized block height value and for which the associated subsurfaces are connected, a smoothing of edges of the blocks being performed.

11. An impeller comprising:
a plurality of blades obtained by modeling at least a portion of a bathtub of each blade, the modeling including:

parameterizing a volume representing said bathtub portion as an assembly of blocks extending from a transverse reference surface of the blade, the blade physically comprising the blocks and each block being:
- associated with a subsurface selected from among a plurality of subsurfaces forming a partition of at least one portion of said transverse reference surface, and
- defined by a block height with respect to said reference surface, a plurality of the blocks having variable and non-uniform block heights, and the variable and non-uniform block heights being used as parameterization parameters, determining optimized values of the block heights with respect to a given aerodynamic and/or thermal criterion, and outputting on an interface of said equipment of the values thus determined, wherein each blade of the plurality of blades is manufactured in conformity with the modeling of the at least one portion of the bathtub obtained.

\* \* \* \* \*